(12) United States Patent
Watanabe et al.

(10) Patent No.: US 11,246,239 B2
(45) Date of Patent: Feb. 8, 2022

(54) HEATSINK

(71) Applicant: FURUKAWA ELECTRIC CO., LTD., Tokyo (JP)

(72) Inventors: Yosuke Watanabe, Tokyo (JP); Kenya Kawabata, Tokyo (JP); Yoshikatsu Inagaki, Tokyo (JP); Tatsuro Miura, Tokyo (JP); Kazuaki Aotani, Tokyo (JP); Toshiaki Nakamura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/027,182

(22) Filed: Sep. 21, 2020

(65) Prior Publication Data

US 2021/0007246 A1  Jan. 7, 2021

Related U.S. Application Data

(63) Continuation of application No. PCT/JP2020/016356, filed on Apr. 14, 2020.

(30) Foreign Application Priority Data

May 10, 2019 (JP) .............................. JP2019-089695

(51) Int. Cl.
*H05K 7/20* (2006.01)

(52) U.S. Cl.
CPC ....... *H05K 7/20336* (2013.01); *H05K 7/2039* (2013.01)

(58) Field of Classification Search
CPC .. H05K 7/20336; H05K 7/2039; F28D 15/04; F28D 15/0275
See application file for complete search history.

(56) References Cited

U.S. PATENT DOCUMENTS 6,738,257 B1 * 5/2004 Lai ...................... F28D 15/0266
165/104.26
2004/0040696 A1  3/2004 Cho et al.
(Continued)

FOREIGN PATENT DOCUMENTS

CN  1494138 A   5/2004
CN  207146269 U  3/2018
(Continued)

OTHER PUBLICATIONS

Decision of Refusal dated Nov. 19, 2019 in Japanese Patent Application No. 2019-089695.
(Continued)

*Primary Examiner* — Gordon A Jones
(74) *Attorney, Agent, or Firm* — Birch, Stewart, Kolasch & Birch, LLP

(57) ABSTRACT

The present disclosure provides a heatsink that can improve heat radiation efficiency of a heat radiating fin and equalize a heat input in a heat receiving portion while securing sufficient volumes of the heat receiving portion, a heat insulating portion, and a heat radiating portion even in an environment in which an installation space for the heatsink, more specifically, an installation space in a width direction of the heatsink is limited.
A heatsink including: a heat transport member having a heat receiving portion thermally connected to a heating element; and a heat radiating fin group which is thermally connected to a heat radiating portion of the heat transport member and in which a plurality of heat radiating fins is arranged, wherein the heat transport member has an integral internal space that communicates from the heat receiving portion to the heat radiating portion and that is filled with a working fluid, and a cross-sectional area of an internal space in a direction orthogonal to a heat transport direction of the heat transport member in the heat radiating portion is larger than (Continued)

the cross-sectional area in a heat insulating portion between the heat receiving portion and the heat radiating portion.

10 Claims, 8 Drawing Sheets

(56) References Cited

U.S. PATENT DOCUMENTS

| | | | |
|---|---|---|---|
| 2004/0069461 | A1 | 4/2004 | Yuyama et al. |
| 2009/0159243 | A1* | 6/2009 | Zhao .................. F28D 15/046 165/104.26 |
| 2015/0181764 | A1* | 6/2015 | Honmura ............... F28D 15/04 165/104.26 |
| 2017/0356694 | A1* | 12/2017 | Tan ........................ B23P 15/26 |
| 2017/0363367 | A1 | 12/2017 | Yeh et al. |
| 2018/0313611 | A1 | 11/2018 | Sasaki |
| 2019/0021188 | A1 | 1/2019 | Phan et al. |
| 2019/0049190 | A1 | 2/2019 | Liu et al. |
| 2019/0331432 | A1 | 10/2019 | Tseng et al. |
| 2020/0340754 | A1* | 10/2020 | Hanafusa ............ F28D 15/0266 |

FOREIGN PATENT DOCUMENTS

| | | |
|---|---|---|
| CN | 108351179 A | 7/2018 |
| JP | 51-15847 A | 2/1976 |
| JP | 51-17058 A | 2/1976 |
| JP | S61-197526 U | 12/1986 |
| JP | 63-104863 U | 7/1988 |
| JP | H04-225791 A | 8/1992 |
| JP | 2000-261175 A | 9/2000 |
| JP | 2003-110072 A | 4/2003 |
| JP | 2004-125381 A | 4/2004 |
| JP | 2011-047593 A | 3/2011 |
| JP | 2015-121373 A | 7/2015 |
| JP | 2015-161448 A | 9/2015 |
| JP | 2016-9828 A | 1/2016 |
| JP | 2018-185110 A | 11/2018 |
| JP | 6485075 B2 | 3/2019 |
| TW | M412344 U1 | 9/2011 |
| TW | I660151 B | 5/2019 |
| WO | WO 2013/005622 A1 | 1/2013 |
| WO | WO 2017/104819 A1 | 6/2017 |
| WO | WO 2017/115772 A1 | 7/2017 |

OTHER PUBLICATIONS

International Search Report, issued in PCT/JP2020/016356, PCT/ISA/210, dated Jul. 14, 2020.
Notice of Reasons for Refusal dated Aug. 14, 2019 in Japanese Patent Application No. 2019-089695.
Notice of Reasons for Refusal dated Jul. 2, 2020 in Taiwan Patent Application No. 109115551.
Written Opinion of the International Searching Authority, issued in PCT/JP2020/016356, PCT/ISA/237, dated Jul. 14, 2020.
English translation of the Written Opinion of the International Searching Authority (Forms PCT/IB/345, PCT/IB/310 and PCT/ISA/237) for International Application No. PCT/JP2020/016356, dated Nov. 9, 2020.
Extended European Search Report for European Application No. 20775154.6, dated May 21, 2021.
Chinese Office Action and Search Report for Chinese Application No. 202010388323.8, dated Mar. 29, 2021, with English translation of the Office Action.

* cited by examiner

HEATSINK

CROSS REFERENCE TO RELATED APPLICATIONS

The present application is a continuation application of International Patent Application No. PCT/JP2020/16356 filed on Apr. 14, 2020, which claims the benefit of Japanese Patent Application No. 2019-089695, filed on May 10, 2019. The contents of these applications are incorporated herein by reference in their entirety.

BACKGROUND

Technical Field

The present disclosure relates to a heatsink for cooling a heating element such as an electric/electronic component.

Background

As a function of an electronic device is improved, many components including a heating element such as an electronic component are mounted at high density inside the electronic device. Also, with improvement in an electronic device, an amount of heat generated by a heating element such as an electronic component is increased. There is a case where a heatsink is used as a means to cool a heating element such as an electronic component inside an electronic device. As a heatsink, a heat pipe-type heatsink including a tubular heat pipe is generally used.

As a conventional heat pipe-type heatsink, for example, there is a heat pipe-type heatsink in which many flat plate-like heat radiating fins are provided in a manner of being protruded to outer peripheral surfaces of a plurality of tubular heat pipes (Japanese Patent Application Laid-Open No. 2003-110072). The heat pipe-type heatsink in Japanese Patent Application Laid-Open No. 2003-110072 is a heatsink that cools a heating element by transporting heat of the heating element to a heat radiating fin by a plurality of tubular heat pipes and by radiating the heat from the heat radiating fin.

On the other hand, recently, many components including a heating element such as an electronic component are mounted at increasingly higher density in a narrow space inside an electronic device. Thus, there is a case where an installation space for a heatsink is limited. Specifically, there is a case where an installation space is limited in a width direction or a length direction of a heatsink although there is an installation space in a height direction of the heatsink. Also, as described above, since an amount of heat generated by an electronic component or the like is increased more and more, there is a case where it is required to further improve cooling performance of a heatsink.

In a heatsink such as the heatsink in Japanese Patent Application Laid-Open No. 2003-110072 which heatsink is a type of transporting heat of a heating element from a heat receiving portion to a heat radiating fin by a plurality of heat pipes, it is necessary to form a heat pipe group in which many heat pipes are arranged in parallel in order to increase an amount of heat transported from the heat receiving portion to the heat radiating fin and to improve cooling performance. Also, in order to improve the cooling performance of the heatsink, it is necessary to improve heat radiation efficiency of the heat radiating fin in order to improve heat radiation performance of the heat radiating fin. However, in order to form the heat pipe group including many heat pipes and to improve the heat radiation efficiency of the heat radiating fin, it is necessary to secure a large space for installation of the heatsink inside an electronic device, more specifically, an installation space in a width direction of the heatsink. That is, in the heat pipe-type heatsink, there is room for improvement in space saving and improvement in cooling performance of the heatsink.

Also, there is an R portion in an outer peripheral surface of each heat pipe, and a void generated on an outer side of the R portion does not contribute to heat transport by the heat pipe group. Thus, volumes of a heat receiving portion, a heat insulating portion, and a heat radiating portion in the heat pipe group are not sufficient, and there is also a case where sufficient cooling performance is not acquired.

Furthermore, when the heat pipe group including many heat pipes is thermally connected to a heating element, an amount of heat received by the heat pipes varies depending on a distance from the heating element. Thus, there is a case where a heat pipe installed away from the heating element does not receive sufficient heat. Thus, there is a problem that cooling performance cannot be sufficiently improved since a heat input in the heat receiving portion of the heat pipe group cannot be sufficiently equalized and thermal resistance between the heat receiving portion of the heat pipe group and the heating element is increased.

SUMMARY

In view of the above situation, the present disclosure is to provide a heatsink that can improve heat radiation efficiency of a heat radiating fin and can equalize a heat input in a heat receiving portion while securing sufficient volumes of the heat receiving portion, a heat insulating portion, and a heat radiating portion even in an environment in which an installation space for the heatsink, more specifically, an installation space in a width direction of the heatsink is limited.

A summary of a configuration of a heatsink of the present disclosure is as follows.

[1] A heatsink including:
a heat transport member having a heat receiving portion thermally connected to a heating element; and a heat radiating fin group which is thermally connected to a heat radiating portion of the heat transport member and in which a plurality of heat radiating fins is arranged, wherein
the heat transport member has an integral internal space that communicates from the heat receiving portion to the heat radiating portion and that is filled with a working fluid, and
a cross-sectional area of an internal space in a direction orthogonal to a heat transport direction of the heat transport member in the heat radiating portion is larger than the cross-sectional area in a heat insulating portion between the heat receiving portion and the heat radiating portion.

[2] The heatsink according to [1], further including a heat transport member having the heat receiving portion thermally connected to the heating element, a pipe body connected to a heat radiating portion of the heat transport member, and a heat radiating fin group which is thermally connected to the pipe body and in which the plurality of heat radiating fins is arranged, wherein
the heat transport member has an integral internal space that communicates from the heat receiving portion to a connection portion with the pipe body and that is filled with the working fluid, the internal space of the heat transport member communicating with an internal space of the pipe body, and the cross-sectional area in the heat radiating portion is larger than the cross-sectional area in the heat insulating portion.

[3] The heatsink according to [1] or [2], wherein the cross-sectional area in the heat receiving portion is the same as the cross-sectional area in the heat insulating portion.

[4] The heatsink according to [1] or [2], wherein the cross-sectional area in the heat receiving portion is larger than the cross-sectional area in the heat insulating portion.

[5] The heatsink according to [2], wherein the pipe body is extended in an arrangement direction of the heat radiating fins.

[6] The heatsink according to [2], wherein an extension direction of the pipe body is not parallel to the heat transport direction of the heat transport member.

[7] The heatsink according to any one of [1] to [6], wherein at least one surface of the heat transport member has a planar shape.

[8] The heatsink according to any one of [1] to [7], wherein the heat transport member has a step portion in a direction orthogonal to the heat transport direction.

In a heat transport member in the above aspect, a part thermally connected to a heating element to be cooled functions as a heat receiving portion, and a part connected to a heat radiating fin or a pipe body functions as a heat radiating portion of the heat transport member. A working fluid receives heat from the heating element and a phase thereof is changed from a liquid phase to a gas phase in the heat receiving portion of the heat transport member, and the gas-phase working fluid releases latent heat and the phase thereof is changed from the gas phase to the liquid phase in the heat radiating portion of the heat transport member. Also, in an aspect of the heatsink of the present disclosure, heat of the heating element is transported by the heat transport member from the heat receiving portion of the heat transport member to the heat radiating portion of the heat transport member. Furthermore, the working fluid which is transported from the heat radiating portion of the heat transport member to the pipe body and the phase of which is changed into the gas phase when the heat transport member receives heat from the heating element flows from the heat transport member to the pipe body. When the gas-phase working fluid flows from the heat transport member to the pipe body, the pipe body receives heat from the heat transport member and further transfers the heat received from the heat transport member to a heat radiating fin group connected to the pipe body. When the pipe body transfers the heat received from the heat transport member to the heat radiating fin group, the phase of the gas-phase working fluid flowing from the heat transport member to the pipe body is changed into the liquid phase. The heat transferred from the pipe body to the heat radiating fin group is released from the heat radiating fin group to an environment outside the heatsink. Also, in the above aspect, a cross-sectional area of an internal space in a direction orthogonal to a heat transport direction of the heat transport member, that is, in a direction from the heat receiving portion to the heat radiating portion in the heat radiating portion is larger than the cross-sectional area in the heat insulating portion. Thus, an internal space of the heat transport member has a part, in which a cross-sectional area varies, in a part between the heat insulating portion and the heat radiating portion.

Note that a "cross-sectional area of an internal space" in a "cross-sectional area of an internal space in a direction orthogonal to a heat transport direction of a heat transport member" means, in a case where a member such as a liquid-phase working fluid or a wick structure is housed in the internal space of the heat transport member, a cross-sectional area including the cross-sectional area of the member.

In an aspect of a heatsink of the present disclosure, an entire internal space of a heat transport member having a heat receiving portion communicates and is integrated unlike an internal space of a heat pipe group in which a plurality of heat pipes is arranged in parallel. Thus, according to the aspect of the heatsink of the present disclosure in which heatsink the heat transport member having the integral internal space transports heat of a heating element from the heat receiving portion to a connection portion with a pipe body thermally connected to a heat radiating fin, a reflux characteristic of a liquid-phase working fluid is good, and a heat input in the heat receiving portion can be equalized and thermal resistance in the heat receiving portion can be reduced even when an amount of heat generated by the heating element is increased. Also, according to an aspect of the heatsink of the present disclosure, a cross-sectional area of an internal space in a direction orthogonal to a heat transport direction of the heat transport member in a heat radiating portion is larger than the cross-sectional area in a heat insulating portion. Thus, the heat radiating fin can be enlarged and many pipe bodies can be thermally connected to the heat radiating fin. Thus, even in an environment in which an installation space for the heatsink is limited, more specifically, in an environment in which an installation space in a width direction of the heatsink is limited although the installation space is enough in a height direction of the heatsink, it is possible to improve heat radiation efficiency of the heat radiating fin while securing sufficient volumes of the heat receiving portion, heat insulating portion, and heat radiating portion. Thus, according to the aspect of the heatsink of the present disclosure, good cooling performance can be delivered with respect to an object to be cooled even in an environment in which an installation space in the width direction of the heatsink is limited.

In such a manner, according to the aspect of the heatsink of the present disclosure, the cross-sectional area in the heat radiating portion is larger than the cross-sectional area in the heat insulating portion. Thus, specifically, even in a case where an installation space is limited in the width direction of the heatsink although the installation space is enough in the height direction of the heatsink, it is possible to improve heat radiation efficiency of the heat radiating fin and to deliver good cooling performance with respect to an object to be cooled. Also, according to the aspect of the heatsink of the present disclosure, the entire internal space of the heat transport member communicates and is integrated. Thus, it is possible to uniformly cool the entire heating element even when heat is generated unevenly in the heating element.

According to an aspect of the heatsink of the present disclosure, the cross-sectional area in the heat receiving portion is larger than the cross-sectional area in the heat insulating portion. Thus, specifically, even in a case where an installation space is limited in the width direction of the heatsink although the installation space is enough in the height direction of the heatsink, it is possible to prevent blockage of reflux to the heat receiving portion by pressure from a gas-phase working fluid when a liquid-phase working fluid flows back from the pipe body and the heat radiating portion of the heat transport member to the heat receiving portion.

According to an aspect of the heatsink of the present disclosure, the pipe body communicating with the internal space of the heat transport member is extended in an arrangement direction of the heat radiating fin. Thus, a gas-phase working fluid flows inside the pipe body in the arrangement direction of the heat radiating fin. Thus, heat radiation efficiency of the heat radiating fin group is improved, and cooling performance of the heatsink is securely improved.

According to an aspect of the heatsink of the present disclosure, an extension direction of the pipe body is not parallel to the heat transport direction of the heat transport member. Thus, heat transported from the heat transport member to the pipe body is transported in a direction different from the extension direction (heat transport direction) of the heat transport member. Thus, it is possible to prevent an increase in a size of the heatsink in a length direction (heat transport direction) of the heat transport member. As a result, a space can be saved.

According to an aspect of the heatsink of the present disclosure, a plurality of the pipe bodies is extended in a plurality of directions from the heat transport member. Thus, heat transported from the heat transport member is transported in the plurality of directions different from the length direction (heat transport direction) of the heat transport member. Thus, it is possible to more securely prevent an increase in a size of the heatsink in the extension direction (heat transport direction) of the heat transport member.

According to an aspect of the heatsink of the present disclosure, the heat transport member has a step portion in a direction orthogonal to the heat transport direction. Thus, even when a forbidden region for an obstacle or the like is set in an installation region for the heat transport member, the heatsink can be installed in a desired position.

DETAILED DESCRIPTION

Figure 1:
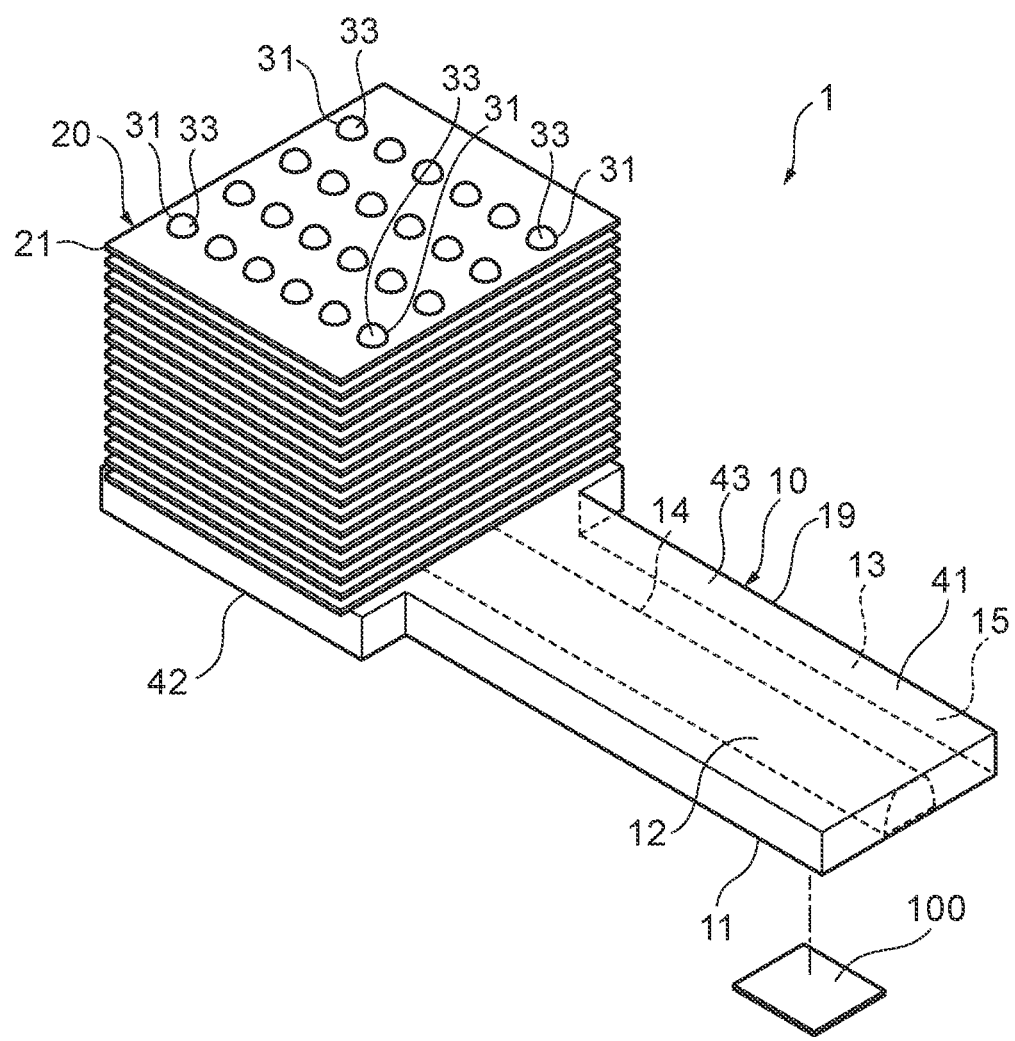
FIG. 1 A perspective view for describing an outline of a heatsink according to a first embodiment of the present disclosure.
Figure 2:
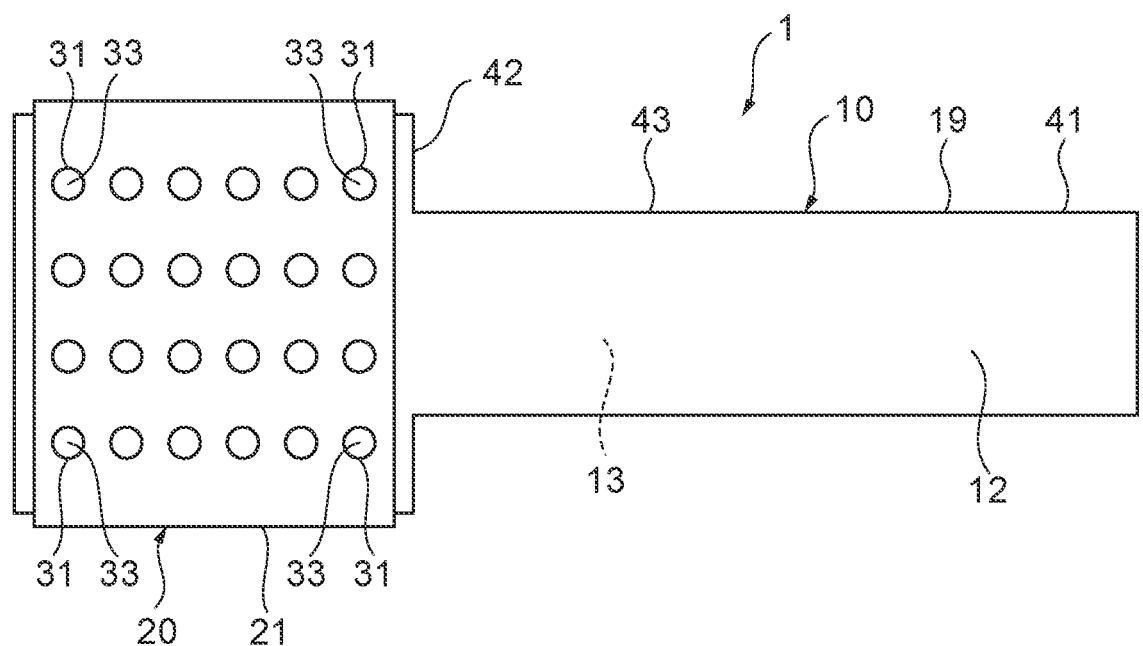
FIG. 2 A plan view for describing the outline of the heatsink according to the first embodiment of the present disclosure.
Figure 3:
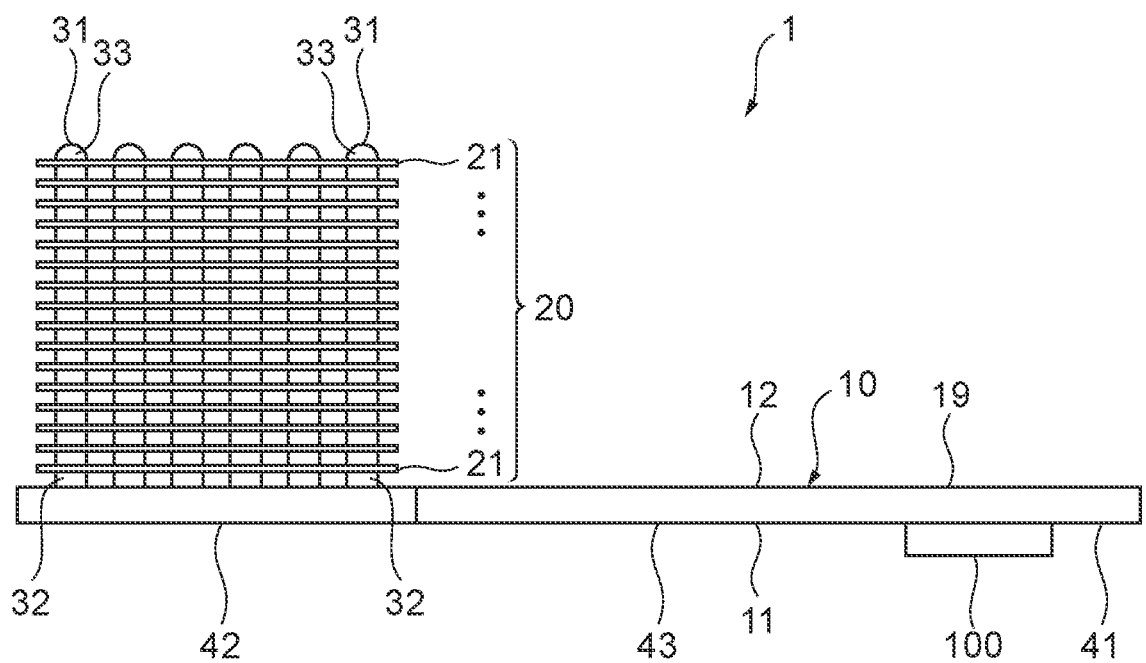
FIG. 3 A side view for describing the outline of the heatsink according to the first embodiment of the present disclosure.
Figure 4:
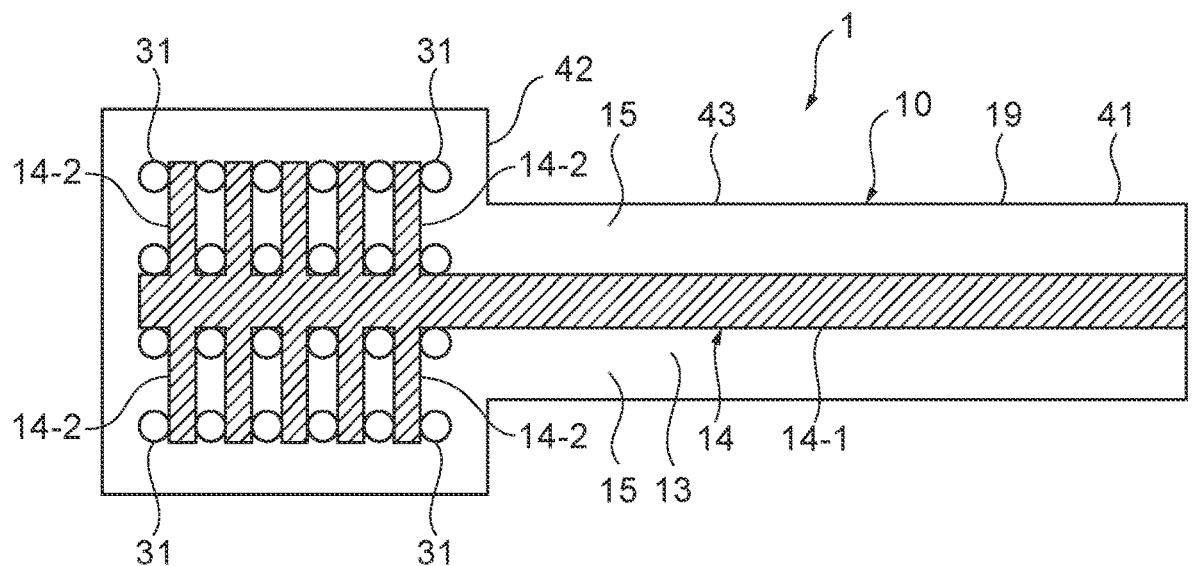
FIG. 4 A view for describing an outline of a wick structure of the heatsink according to the first embodiment of the present disclosure in planar view.

In the following, heatsinks according to embodiments of the present disclosure will be described with reference to the drawings. First, a heatsink according to a first embodiment of the present disclosure will be described. FIG. 1 is a perspective view for describing an outline of the heatsink according to the first embodiment of the present disclosure. FIG. 2 is a plan view for describing the outline of the heatsink according to the first embodiment of the present disclosure. FIG. 3 is side view for describing the outline of the heatsink according to the first embodiment of the present disclosure. FIG. 4 is a view for describing an outline of a wick structure of the heatsink according to the first embodiment of the present disclosure in planar view.

As illustrated in FIGS. 1 to 3, a heatsink 1 according to the first embodiment of the present disclosure includes a heat transport member 10 having a heat receiving portion 41 thermally connected to a heating element 100, a heat radiating fin group 20 thermally connected to the heat transport member 10, and a pipe body 31 thermally connected to the heat radiating fin group 20. The heat radiating fin group 20 includes a plurality of heat radiating fins 21, 21, ... attached to the pipe body 31. In a heat radiating portion 42 of the heat transport member 10, the pipe body 31 is connected to the heat transport member 10. Also, an internal space of the heat transport member 10 communicates with an internal space of the pipe body 31. That is, in the heatsink 1 according to the first embodiment, the heat transport member 10 has an integral internal space that communicates from the heat receiving portion 41 to a connection portion with the pipe body 31 and that is filled with a working fluid (not illustrated).

As illustrated in FIG. 1, the heat transport member 10 includes a container 19 having a hollow cavity 13, and a working fluid flowing in the cavity 13. A wick structure 14 having capillary force is housed in the cavity 13. The container 19 is formed by joining of one plate-like body 11, and the other plate-like body 12 facing the one plate-like body 11.

The one plate-like body 11 has a plate shape having a side wall erected from a plane portion at an edge of the plane portion. The other plate-like body 12 also has a plate shape having a side wall erected from a plane portion at an edge of the plane portion. Thus, each of the one plate-like body 11 and the other plate-like body 12 has a recessed shape. The container 19 having the cavity 13 is formed by joining of the one recessed plate-like body 11 and the other recessed plate-like body 12. Thus, a shape of the container 19 is planar. The cavity 13 is an internal space that is sealed from an external environment, and is depressurized by deaeration processing.

A part of an outer surface of the container 19 to which part the heating element 100 to be cooled is thermally connected is the heat receiving portion 41, and the heating element 100 is cooled by being thermally connected to the container 19. In the heat transport member 10, the heat receiving portion 41 is formed at one end since the heating element 100 is thermally connected to the one end.

The heat transport member 10 is extended in a predetermined direction from a position of the heating element 100, and the heat radiating fin group 20 is thermally connected, via the pipe body 31, to the other end opposite to one end. The other end of the heat transport member 10 to which end the heat radiating fin group 20 is thermally connected via the pipe body 31 functions as the heat radiating portion 42 of the heat transport member 10.

In the heat transport member 10, an intermediate portion placed between the heat receiving portion 41 placed at the one end of the container 19 and the heat radiating portion 42 placed at the other end of the container 19 functions as a heat insulating portion 43. The heat insulating portion 43 is a part to which neither the heat radiating fin group 20 nor the heating element 100 is thermally connected. Heat transferred from the heating element 100 to the heat receiving portion 41 is transported from the heat receiving portion 41 to the heat radiating portion 42 in an extension direction of the heat insulating portion 43. Thus, by securing a cross-sectional area of the internal space (that is, cavity 13) in a direction orthogonal to the heat transport direction of the heat transport member 10 (hereinafter, may be simply referred to as cross-sectional area of cavity 13) in the heat insulating portion 43 for a predetermined area or more, it is possible to contribute to providing the heat transport member 10 with a desired heat transport amount. Note that as described above, a "cross-sectional area of a cavity 13" means, in a case where a member such as a liquid-phase working fluid or the wick structure 14 is housed in the cavity 13 of the heat transport member 10, a cross-sectional area including the cross-sectional area of the member.

As illustrated in FIGS. 1 and 2, the cross-sectional area of the cavity 13 varies between the heat receiving portion 41 and the heat radiating portion 42 in the heatsink 1. Specifically, in the heatsink 1, the cross-sectional area of the cavity 13 varies between the heat insulating portion 43 and the heat radiating portion 42. More specifically, the heatsink 1 has an aspect that the cross-sectional area of the cavity 13 in the heat radiating portion 42 is larger than the cross-sectional area of the cavity 13 in the heat insulating portion 43. Also, the cross-sectional area of the cavity 13 in the heat insulating portion 43 is substantially the same as the cross-sectional area of the cavity 13 in the heat receiving portion 41.

In the heatsink 1, a thickness of the container 19 and wall thicknesses of the one plate-like body 11 and the other plate-like body 12 are substantially the same from one end to the other end of the container 19. Thus, the container 19 has a shape in which a size in a direction orthogonal to the heat transport direction (width direction) varies in planar view. Specifically, in planar view, a size of the heat transport member 10 in the width direction varies between the heat insulating portion 43 and the heat radiating portion 42. More specifically, an aspect that a size in the width direction of the heat transport member 10 in the heat radiating portion 42 is larger than the size in the width direction of the heat transport member 10 in the heat insulating portion 43 is employed. Also, the size in the width direction of the heat transport member 10 in the heat insulating portion 43 is substantially the same as the size in the width direction of the heat transport member 10 in the heat receiving portion 41. Note that the "planar view" refers to a state of being viewed in a direction vertical to a plane portion of the heat transport member 10.

A ratio of the cross-sectional area of the cavity 13 in the heat radiating portion 42 to the cross-sectional area of the cavity 13 in the heat insulating portion 43 is not specifically limited as long as being larger than 1.0. However, the ratio is preferably larger than 1.0 and equal to or smaller than 4.0, and is particularly preferably equal to or larger than 2.0 and equal to or smaller than 3.5 from a point of making a gas-phase working fluid smoothly flow to the heat radiating portion 42 while improving heat radiation efficiency of the heat radiating fin 21 and of the heat radiating fin group 20 eventually by thermally connecting more pipe bodies 31 to the heat radiating fin 21 even in a case where an installation space for the heatsink 1, more specifically, an installation space in a width direction of the heatsink 1 is limited.

Also, in the heat transport member 10, the heat receiving portion 41, the heat insulating portion 43, and the heat radiating portion 42 are extended on the same plane. Thus, it is possible to prevent an increase in a size of the heatsink 1 in a height direction, more specifically, sizes of the heat receiving portion 41 and the heat insulating portion 43 in the height direction.

As illustrated in FIGS. 1 and 4, the wick structure 14 is extended from the heat receiving portion 41 to the heat radiating portion 42 of the container 19. The wick structure 14 is not specifically limited, and examples thereof include a sintered body of metal powder such as copper powder, a metal mesh made of a metal wire, a groove (plurality of narrow groove), a nonwoven fabric, a metal fiber, and the like. In the heat transport member 10, a sintered body of metal powder is used as the wick structure 14. A part of the cavity 13 in which part the wick structure 14 is not provided functions as a steam flow channel 15 through which a gas-phase working fluid flows. The steam flow channel 15 is extended from the heat receiving portion 41 to the heat radiating portion 42 of the container 19 in such a manner as to correspond to the wick structure 14 being extended from the heat receiving portion 41 to the heat radiating portion 42 of the container 19. The heat transport member 10 transports heat of the heating element 100, which heat is received by the heat receiving portion 41, from the heat receiving portion 41 to the heat radiating portion 42 by a heat transport characteristic due to an operation of the working fluid.

Also, as illustrated in FIG. 4, in the heatsink 1, the wick structure 14 has a trunk portion 14-1 extended from the heat receiving portion 41 to the heat radiating portion 42 of the heat transport member 10, and a plurality of branch portions 14-2 branching from the trunk portion 14-1 in a plane direction of the heat transport member 10 in the heat radiating portion 42. The plurality of branch portions 14-2 of the wick structure 14 is extended in both right and left directions with the trunk portion 14-1 as a center. Also, the branch portions 14-2 of the wick structure 14 are extended in a direction substantially orthogonal to an extension direction (longitudinal direction) of the trunk portion 14-1. In order to secure a sufficient space for the steam flow channel 15, it is preferable that a thickness of the branch portions 14-2 is smaller than a thickness of the trunk portion 14-1. For example, while the trunk portion 14-1 is in contact with a top surface and a bottom surface of the cavity 13, the branch portions 14-2 are not in contact with the top surface although being in contact with the bottom surface of the cavity 13. Since the wick structure 14 branches into the plurality of branch portions 14-2 in the heat radiating portion 42, a working fluid a phase of which is changed from a gas phase to a liquid phase in the heat radiating portion 42 is prevented from staying in the heat radiating portion 42 and can more smoothly flow back from the heat radiating portion 42 to the heat receiving portion 41.

As illustrated in FIGS. 1 to 3, a plurality of pipe bodies 31, 31, . . . internal spaces of which communicate with the cavity 13 of the container 19 is provided at the other end that is the heat radiating portion 42 of the heat transport member 10. Thus, a space from the cavity 13 of the heat transport member 10 to the inside of the pipe bodies 31 is filled with the working fluid flowing in the cavity 13. Although not being specifically limited, a shape of each of the pipe bodies 31 is a linear shape in a longitudinal direction and is a circular shape in a direction orthogonal to the longitudinal direction in the heatsink 1. Also, all of the pipe bodies 31 have substantially the same shape and size.

The pipe bodies 31 are extended in a direction substantially orthogonal to a plane direction of the planar heat transport member 10 and in a direction substantially orthogonal to the heat transport direction of the planar heat transport member 10. That is, the pipe bodies 31 are provided in an erected manner in a plane portion of the heat radiating portion 42 of the heat transport member 10. In the heatsink 1, the pipe bodies 31 are provided in an erected manner on the plane portion of the other plate-like body 12. From the above, the pipe body 31 is not extended in the width direction of the heat transport member 10. In the heatsink 1, heat transported from the heat transport member 10 is transported by the pipe bodies 31 in a direction different from an extension direction (longitudinal direction) of the heat transport member 10 since an extension direction (longitudinal direction) of the pipe bodies 31 is not parallel to the heat transport direction of the heat transport member 10. Thus, it is possible to prevent an increase in a size of the heatsink 1 in the heat transport direction of the heat transport member 10 and to save a space of the heatsink 1. Also, since the pipe bodies 31 are not extended in the width direction of the heat transport member 10, an increase in a size of the heatsink 1 in the width direction can be prevented.

In the heatsink 1, the plurality of pipe bodies 31, 31, . . . is extended in substantially the same direction from the heat transport member 10. In the heatsink 1, the pipe bodies 31 provided in an erected manner on the heat radiating portion 42 are arranged in parallel at a predetermined interval in the longitudinal direction and the width direction of the heat transport member 10. Also, the pipe bodies 31 are arranged from a central portion to an edge of the heat radiating portion 42 in planar view.

An end portion 32 on a side of the cavity 13 (hereinafter, also referred to as "base portion") of each of the pipe bodies 31 is opened, and an end portion 33 opposite to the cavity 13 (hereinafter, also referred to as "leading-end portion") is closed. Also, the cavity 13 of the container 19 and the internal space of the pipe body 31 communicate with each other, and the internal space of the pipe body 31 is depressurized by deaeration processing as in the case of the cavity 13. Thus, the working fluid can flow between the cavity 13 of the container 19 and the internal space of the pipe body 31.

A through hole (not illustrated) for attachment of the pipe body 31 to the container 19 is formed in a plane portion of the container 19. In the heatsink 1, a through hole for attachment the pipe body 31 to the container 19 is formed in the other plate-like body 12. A shape and size of the through hole correspond to a shape and size of the pipe body 31. By insertion of the base portion 32 of the pipe body 31 into the through hole in the container 19, the pipe body 31 is connected to the container 19. Thus, the pipe body 31 and the container 19 include different members. A method of fixing the pipe body 31 attached to the container 19 is not specifically limited, and examples thereof include welding, soldering, brazing, and the like.

The pipe body 31 and the container 19 of the heat transport member 10 include different members. Thus, an arrangement, shape, size, and the like of the pipe body 31 can be freely selected, and a degree of freedom in designing of a shape of the heatsink 1 is improved. Also, in the heatsink 1, since the pipe body 31 can be attached to the container 19 by insertion of the pipe body 31 into the through hole in the container 19, assembly is easy.

A different wick structure (not illustrated) that generates capillary force and that is different from the wick structure 14 housed in the container 19 is provided on an inner surface of the pipe body 31. The different wick structure is not specifically limited, and examples thereof include a sintered body of metal powder such as copper powder, a metal mesh made of a metal wire, a plurality of narrow grooves (groove), a nonwoven fabric, a metal fiber, and the like. The different wick structure is extended in the longitudinal direction of the pipe body 31.

When necessary, the different wick structure provided in the pipe body 31 may be connected, via a connection member (not illustrated), to the wick structure 14 provided in the heat transport member 10. A working fluid which releases latent heat and a phase of which is changed from a gas phase to a liquid phase inside the pipe body 31 flows back in a direction from the leading-end portion 33 to the base portion 32 of the pipe body 31 in the different wick structure by capillary force of the different wick structure in an inner surface of the pipe body 31. The liquid-phase working fluid that flows back to the base portion 32 of the pipe body 31 flows from the different wick structure to one end of the connection member. The liquid-phase working fluid that flows from the different wick structure to the one end of the connection member can flow from the one end to the other end in the connection member, and can flow back from the other end of the connection member to the wick structure 14 of the heat transport member 10.

From the above, by provision of the connection member between the wick structure 14 and the different wick structure, the working fluid the phase of which is changed into the liquid phase inside the pipe body 31 can flow back more smoothly from the pipe body 31 to the wick structure 14 of the heat transport member 10. Examples of the connection member include a wick member having capillary force, and more specifically include a metal mesh, a braided metal wire, a metal fiber, and the like. From the above, since a flowing characteristic of the liquid-phase working fluid between the pipe body 31 and the heat transport member 10 is improved, cooling performance of the heatsink 1 is further improved.

Examples of materials of the container 19 and the pipe body 31 include copper, a copper alloy, aluminum, an aluminum alloy, nickel, a nickel alloy, stainless steel, titanium, a titanium alloy, and the like. The working fluid to fill the cavity 13 of the container 19 and the internal space of the pipe body 31 can be arbitrarily selected according to compatibility with the materials of the container 19 and the pipe body 31, and examples thereof include water, fluorocarbons, hydrofluoroether (HFE), cyclopentane, ethylene glycol, a mixture thereof, and the like.

A thickness of the container 19 can be arbitrarily selected according to mechanical strength, weight, and the like and can be 0.5 to 3 mm, for example. A cross-sectional area of the cavity 13 in the heat insulating portion 43 can be, for example, 250 to 350 mm$^2$. The cross-sectional area of the cavity 13 in the heat radiating portion 42 can be, for example, 350 to 1500 mm$^2$. Also, a diameter of the pipe body 31 can be arbitrarily selected according to mechanical strength, weight, and the like and can be 5 to 10 mm, for example.

As illustrated in FIGS. 1 and 3, the heat radiating fin group 20 is formed by arrangement of a plurality of heat radiating fins 21, 21, . . . in parallel. The heat radiating fins 21 are thin flat plate-like members. The heat radiating fins 21 are attached and fixed to positions of pipe bodies 31, and are thermally connected to the pipe bodies 31. The plurality of pipe bodies 31, 31, . . . are attached from a central portion to an edge of a main surface of each of the heat radiating fins 21 in such a manner as to correspond to the pipe bodies 31 being arranged from a central portion to an edge of the heat radiating portion 42 in planar view. Also, since a size in the width direction of the heat transport member 10 in the heat radiating portion 42 is larger than the size in the width direction of the heat transport member 10 in the heat insulating portion 43, the main surfaces of the heat radiating fins 21 can be enlarged.

The heat radiating fins 21 are arranged in parallel at a predetermined interval in a direction substantially parallel to the longitudinal direction of the pipe bodies 31. Thus, the pipe bodies 31 are extended in an arrangement direction of the heat radiating fins 21. Note that all of the heat radiating fins 21 thermally connected to the pipe bodies 31 have substantially the same shape and size.

The main surface of each of the heat radiating fins 21 is a surface that mainly has a heat radiating function of the heat radiating fin 21. The main surface of the heat radiating fin 21 is arranged to be in a direction substantially orthogonal to the extension direction of the pipe bodies 31, that is, the longitudinal direction of the pipe bodies 31. Cooling air is supplied in a direction substantially parallel to the heat transport direction of the heat transport member 10. A method of thermally connecting the heat radiating fins 21 to the pipe bodies 31 is not specifically limited, and any known method can be used. For example, a method of forming through holes in the heat radiating fins 21 and inserting the pipe bodies 31 into the through holes, bonding by soldering, and the like are used.

The heatsink 1 is forcibly air-cooled by a blower fan (not illustrated), for example. Cooling air derived from the blower fan is supplied along the main surfaces of the heat radiating fins 21 and the heat radiating fins 21 are cooled.

A material of the heat radiating fins 21 is not specifically limited, and examples thereof include metal such as copper, a copper alloy, aluminum, and an aluminum alloy, a carbon material such as graphite, a composite member using the carbon material, and the like.

Next, a mechanism of a cooling function of the heatsink 1 will be described. First, the heating element 100 that is an object to be cooled is thermally connected to one end of an outer surface of the container 19 of the heat transport member 10, and the one end is made to function as the heat receiving portion 41. In the heatsink 1, the heating element 100 is attached to one end of the one plate-like body 11 of the container 19. That is, the heating element 100 is attached to a plane portion facing a plane portion of the heat transport member 10 to which portion the pipe bodies 31 and the heat radiating fin group 20 are attached. When the one end of the container 19 receives heat from the heating element 100, the heat is transferred to a liquid-phase working fluid in the cavity 13 at the one end of the container 19, and the liquid-phase working fluid is changed into a gas-phase working fluid in the cavity 13 at the one end of the container 19. The gas-phase working fluid flows in the steam flow channel 15 from the one end of the container 19 to the other end that is the heat radiating portion 42. When the gas-phase working fluid flows from the one end to the other end of the container 19, the heat transport member 10 transports the heat from the one end to the other end.

Since the cavity 13 of the container 19 and the internal spaces of the pipe bodies 31 connected to the plane portion of the container 19 communicate with each other, the gas-phase working fluid flowing from the one end to the other end of the container 19 flows from the cavity 13 of the container 19 into the internal spaces of the pipe bodies 31. The gas-phase working fluid that flows into the internal spaces of the pipe bodies 31 releases latent heat inside the pipe bodies 31 while flowing in the longitudinal direction of the pipe bodies 31, and is changed into a liquid-phase working fluid. The latent heat released inside the pipe bodies 31 is transferred to the heat radiating fins 21 (heat radiating fin group 20) attached to positions of the pipe bodies 31. The heat transferred to the heat radiating fins 21 (heat radiating fin group 20) thermally connected to the pipe bodies 31 is released from the heat radiating fins 21 (heat radiating fin group 20) to an environment outside the heatsink 1. The working fluid the phase of which is changed from the gas phase into the liquid phase inside the pipe bodies 31 flows back from central portions and the leading-end portions 33 of the pipe bodies 31 to the base portions 32 of the pipe bodies 31 by the capillary force of the different wick structures in the inner surfaces of the pipe bodies 31. The liquid-phase working fluid that flows back to the base portions 32 of the pipe bodies 31 flows back from the base portions 32 of the pipe bodies 31 to the wick structure 14 provided in the heat transport member 10. The liquid-phase working fluid that flows back to the wick structure 14 provided in the heat transport member 10 flows back to the one end of the container 19 by the capillary force of the wick structure 14.

In the heatsink 1 according to an embodiment of the present disclosure, the entire cavity 13 of the heat transport member 10 communicates and is integrated unlike a cavity of the heat pipe group in which a plurality of heat pipes is arranged in parallel. From the above, in the heatsink 1, since the heat transport member 10 having the integral cavity 13 transports heat of the heating element 100 from the heat receiving portion 41 to the connection portion with the pipe bodies 31 thermally connected to the heat radiating fin group 20, a reflux characteristic of a liquid-phase working fluid is good, and a heat input in the heat receiving portion 41 can be equalized and thermal resistance in the heat receiving portion 41 can be reduced even when an amount of heat generated by the heating element 100 is increased.

Also, in the heatsink 1, the cross-sectional area of the cavity 13 in the heat radiating portion 42 is larger than the cross-sectional area of the cavity 13 in the heat insulating portion 43 and the cross-sectional area of the cavity 13 in the heat receiving portion 41. Thus, main surfaces of the heat radiating fins 21 are enlarged, and the plurality of pipe bodies 31, 31, . . . are attached from a central portion to an edge of the main surface of each of the heat radiating fins 21. From the above, heat radiation efficiency is improved in the entire main surfaces of the heat radiating fins 21. Thus, even in a case where an installation space is limited in the width direction of the heatsink although the installation space is enough in the height direction of the heatsink, heat radiation performance of the heat radiating fin group 20 can be improved. From the above, in the heatsink 1, even in a case where an installation space is limited in the width direction of the heatsink although the installation space is enough in the height direction of the heatsink, heat radiation performance of the heat radiating fin group 20 is improved and good cooling performance can be delivered with respect to the heating element 100. Also, since the entire cavity 13 of the heat transport member 10 communicates and is integrated, the entire heating element 100 can be uniformly cooled even when heat is generated unevenly in the heating element 100.

Figure 5:
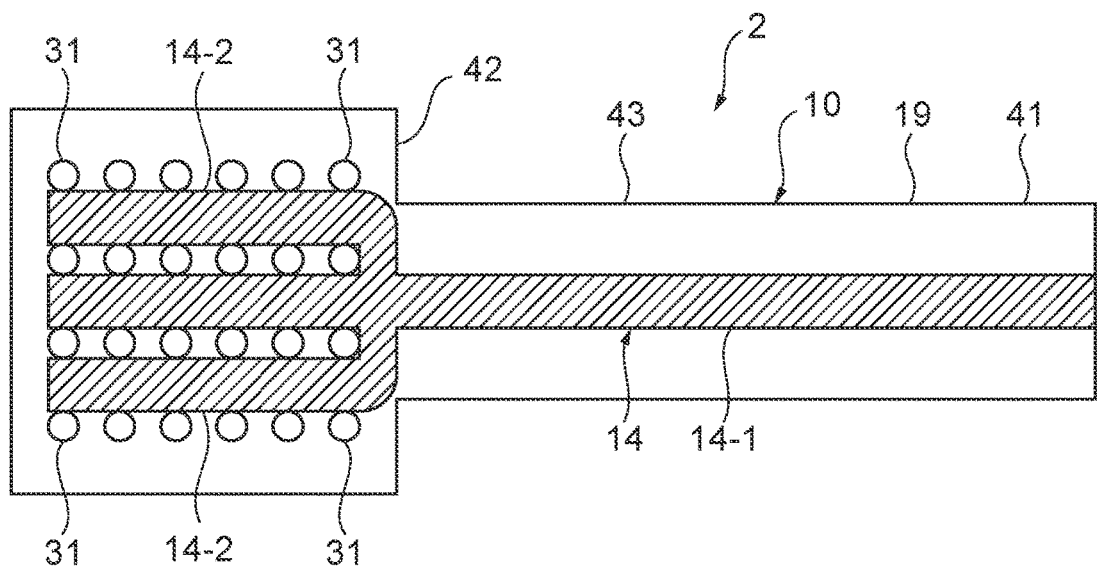
FIG. 5 A view for describing an outline of a wick structure of a heatsink according to a second embodiment of the present disclosure in planar view.

Next, a heatsink according to a second embodiment of the present disclosure will be described with reference to the drawing. Note that since the heatsink according to the second embodiment has a main portion in common with that of a heatsink according to the first embodiment, the same reference sign is used to describe the same component. Note that FIG. 5 is a view for describing an outline of a wick structure of the heatsink according to the second embodiment of the present disclosure in planar view.

In a heatsink according to the first embodiment, a wick structure has a trunk portion, and a plurality of branch portions extended from the trunk portion in a direction substantially orthogonal to an extension direction of the trunk portion. Alternatively, as illustrated in FIG. 5, in a heatsink 2 according to the second embodiment, a plurality of branch portions 14-2 branching from a trunk portion 14-1 of a wick structure 14 in a heat radiating portion 42 is extended in a direction substantially parallel to an extension direction of the trunk portion 14-1 of the wick structure 14. The branch portions 14-2 are extended in both right and left directions with the trunk portion 14-1 as a center in a plane direction of a heat transport member 10.

Also in the heatsink 2, a working fluid a phase of which is changed from a gas phase to a liquid phase in the heat radiating portion 42 can more smoothly flow back to a heat receiving portion 41 since the wick structure 14 branches into the plurality of branch portions 14-2 in the heat radiating portion 42.

Figure 6:
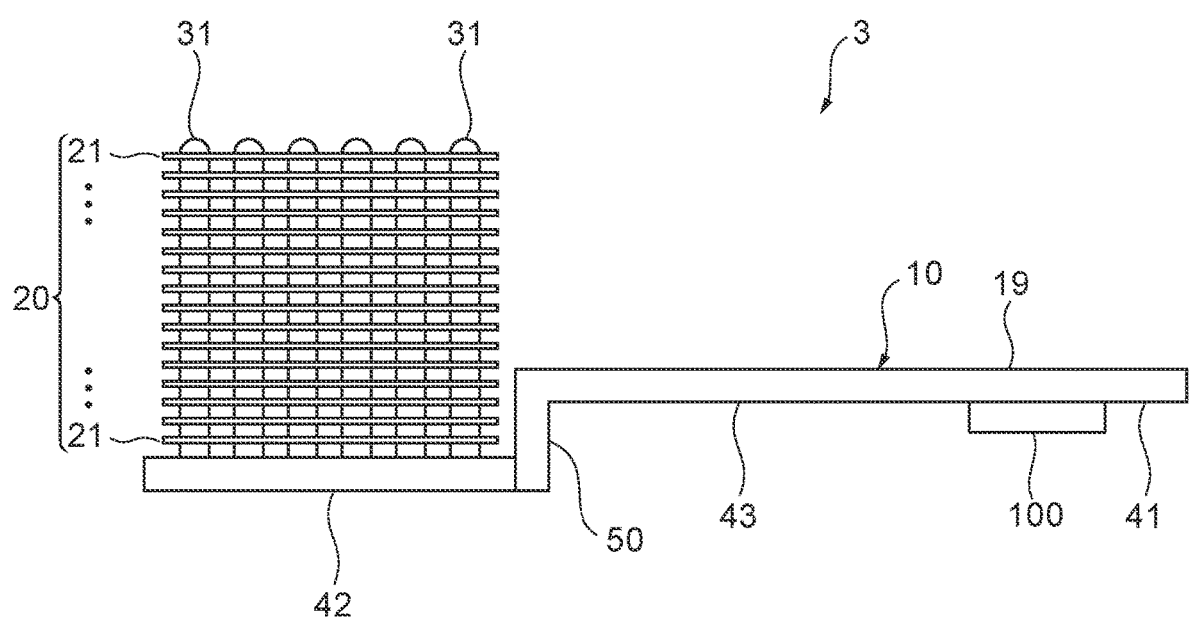
FIG. 6 A side view for describing an outline of a heatsink according to a third embodiment of the present disclosure.

Next, a heatsink according to a third embodiment of the present disclosure will be described with reference to the drawing. Note that since the heatsink according to the third embodiment has a main portion in common with those of the heatsinks according to the first and second embodiments, the same reference sign is used to describe the same component. Note that FIG. 6 is a side view for describing an outline of a heatsink according to the third embodiment of the present disclosure.

In a heatsink according to the first embodiment, a heat receiving portion, a heat insulating portion, and a heat radiating portion of a heat transport member are extended on the same plane. Alternatively, as illustrated in FIG. 6, in a heatsink 3 according to the third embodiment, a step portion 50 is provided in a heat transport member 10 in a direction substantially orthogonal to a heat transport direction of the heat transport member 10, that is, in a height direction of the heatsink 3. In the heatsink 3, the step portion 50 is provided between a heat insulating portion 43 and a heat radiating portion 42. From the above, the heat radiating portion 42 is not extended on the same plane as a heat receiving portion 41 and the heat insulating portion 43 in the heat transport member 10 of the heatsink 3.

Since the step portion 50 is included, even when a forbidden region for an obstacle or the like is set in a region between the heat receiving portion 41 and the heat radiating portion 42 of the heat transport member 10, the heatsink 3 can be installed in a desired position.

Next, a heatsink according to a fourth embodiment of the present disclosure will be described with reference to the drawing. Note that since the heatsink according to the fourth embodiment has a main portion in common with those of the heatsinks according to the first to third embodiments, the same reference sign is used to describe the same component. Note that FIG. 7 is a perspective view for describing an outline of the heatsink according to the fourth embodiment of the present disclosure.

Figure 7:
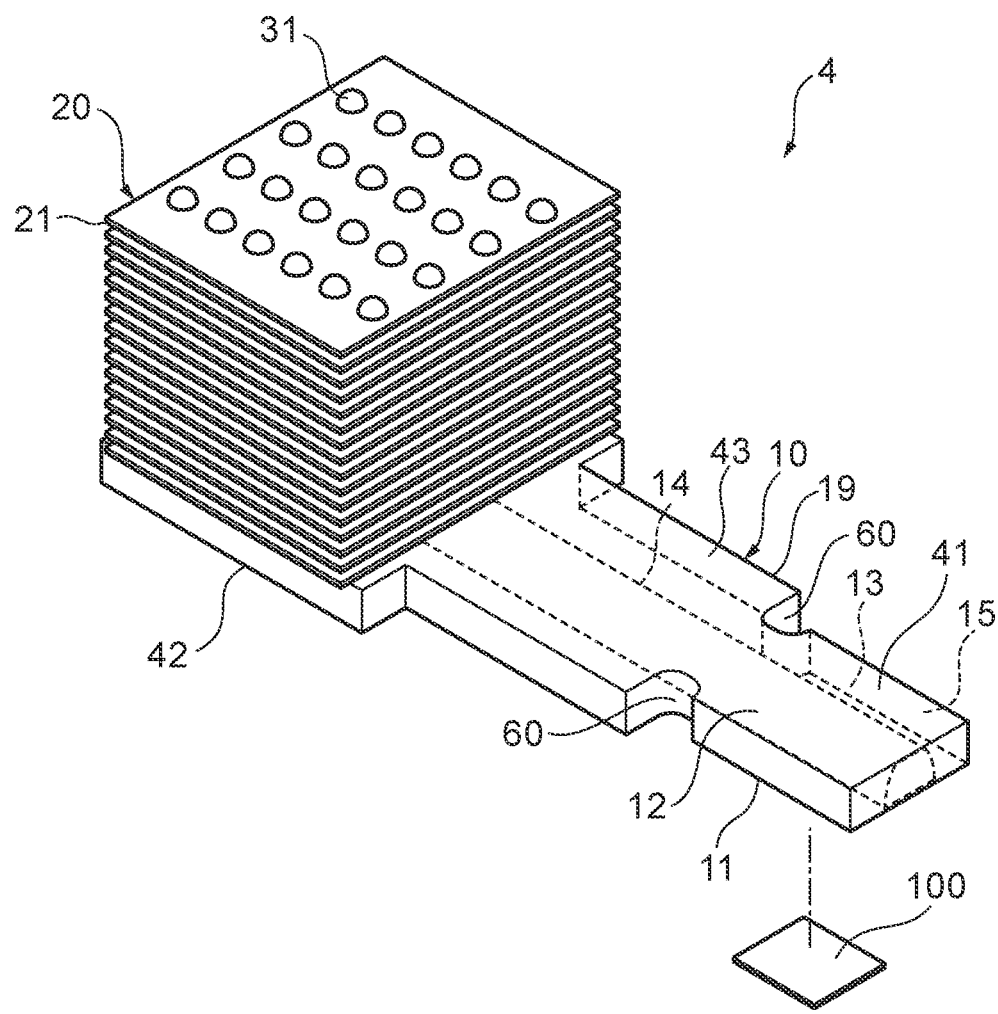
FIG. 7 A perspective view for describing an outline of a heatsink according to a fourth embodiment of the present disclosure.

As illustrated in FIG. 7, in a heatsink 4 according to the fourth embodiment, a constriction portion 60 in which a size in a width direction of a heat transport member 10 is smaller than those in a heat insulating portion 43 and a heat receiving portion 41 is included between the heat insulating portion 43 and the heat receiving portion 41 in planar view. Also, in the heatsink 4, the size in the width direction of the heat transport member 10 in the heat receiving portion 41 is smaller than the size in the width direction of the heat transport member 10 in the heat insulating portion 43.

Since the constriction portion 60 is formed between the heat insulating portion 43 and the heat receiving portion 41 in the heatsink 4, the heatsink 4 in which a main surface of a heat radiating fin 21 is enlarged and a plurality of pipe bodies 31, 31, . . . is attached from a central portion to an edge of the main surface of the heat radiating fin 21 can be installed even in a case where an installation space in the width direction of the heat transport member 10 is limited in a region between the heat insulating portion 43 and the heat receiving portion 41. Also, in the heatsink 4, a size in the width direction of the heat transport member 10 in the heat receiving portion 41 is smaller than the size in width direction of the heat transport member 10 in the heat insulating portion 43. Thus, even in a case where an installation space in the width direction of the heat transport member 10 is limited in a region of the heat receiving portion 41, the heatsink 4 in which the main surface of the heat radiating fin 21 is enlarged and the plurality of pipe bodies 31, 31, . . . is attached from the central portion to the edge on the main surface of the heat radiating fin 21 can be installed.

Figure 8:
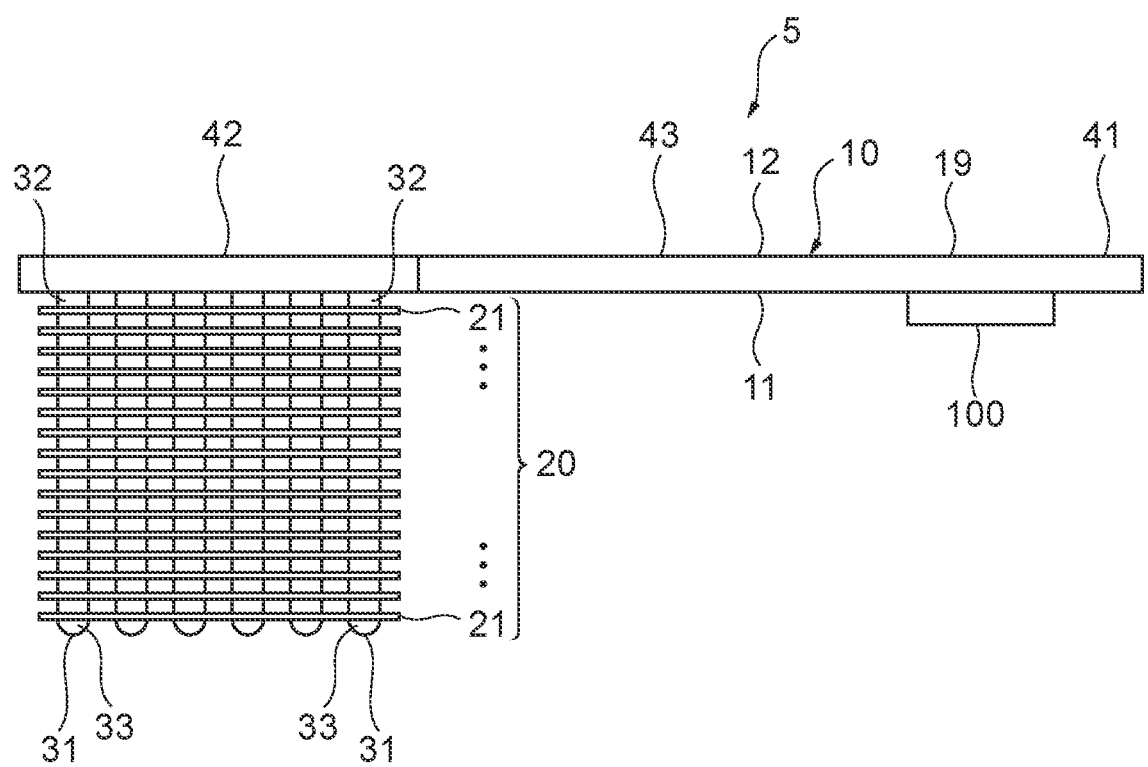
FIG. 8 A side view for describing an outline of a heatsink according to a fifth embodiment of the present disclosure.

Next, a heatsink according to a fifth embodiment of the present disclosure will be described with reference to the drawings. Note that since the heatsink according to the fifth embodiment has a main portion in common with those of the heatsinks according to the first to fourth embodiments, the same reference sign is used to describe the same component. Note that FIG. 8 is a side view for describing an outline of the heatsink according to the fifth embodiment of the present disclosure.

In a heatsink according to the first embodiment, a pipe body is provided in an erected manner on a flat portion of the other plate-like body of a container. Alternatively, as illustrated in FIG. 8, a pipe body 31 is provided in an erected manner in a plane portion of one plate-like body 11 of a container 19 in a heatsink 5 according to the fifth embodiment. In the heatsink 5, a heating element 100 and the pipe body 31 are attached to the one plate-like body 11. Thus, the pipe body 31 and a heat radiating fin group 20 are provided on the same plane portion of the heat transport member 10 as the heating element 100.

The heatsink 5 can deliver good cooling performance for the heating element 100 in a case where there is an installation space below an installation position of the heating element 100 in a height direction of the heatsink.

Figure 9:
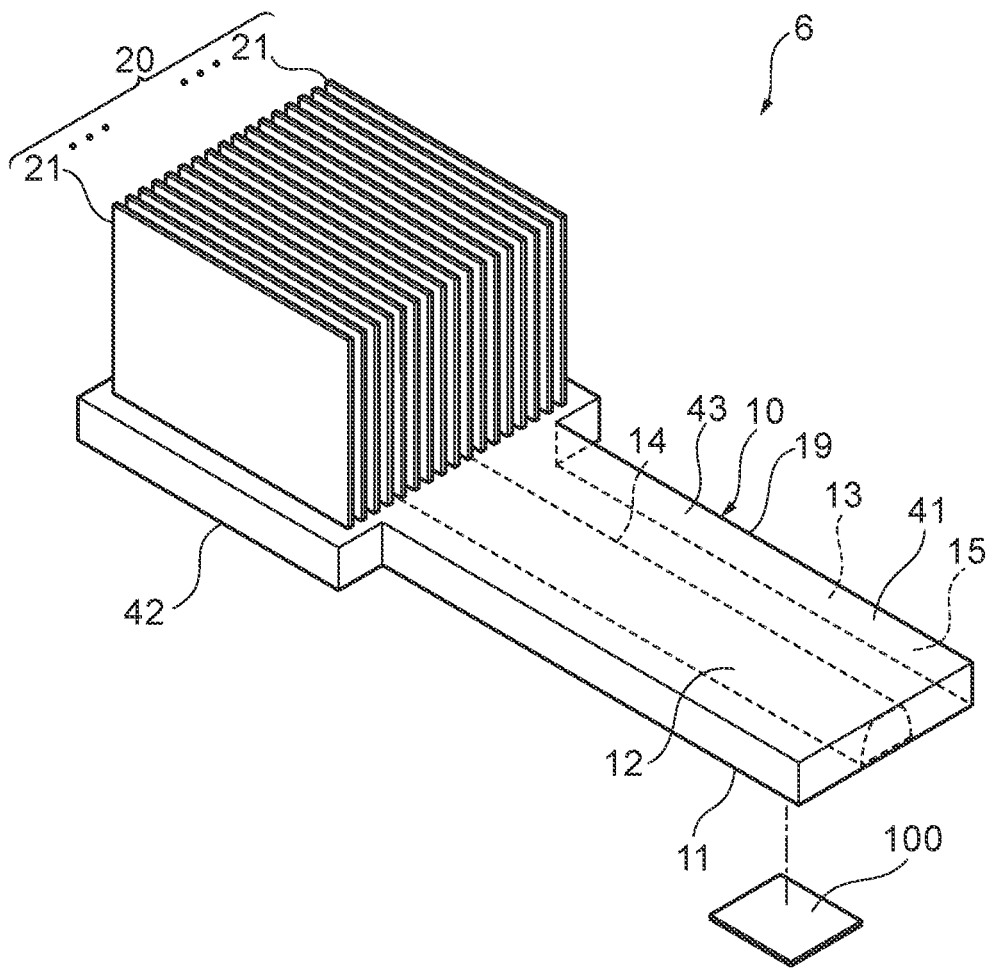
FIG. 9 A perspective view for describing an outline of a heatsink according to a sixth embodiment of the present disclosure.

Next, a heatsink according to a sixth embodiment of the present disclosure will be described with reference to the drawing. Note that since the heatsink according to the sixth embodiment has a main portion in common with those of the heatsinks according to the first to fifth embodiments, the same reference sign is used to describe the same component. Note that FIG. 9 is a perspective view for describing an outline of the heatsink according to the sixth embodiment of the present disclosure.

In a heatsink of each of the first to fifth embodiments, a pipe body an internal space of which communicates with a cavity of a container is connected to a heat transport member, and a plurality of heat radiating fins is thermally connected to the pipe body. Alternatively, as illustrated in FIG. 9, a pipe body an internal space of which communicates with a cavity 13 of a container 19 is not connected to a heat transport member 10 in a heatsink 6 according to the sixth embodiment. Also in the heatsink 6, a heating element 100 is thermally connected to one end of the container 19, and the one end of the container 19 functions as a heat receiving portion 41. On the other hand, in the heatsink 6, a heat radiating fin group 20 is formed by attachment of a plurality of heat radiating fins 21, 21, . . . to the other end of the container 19 which end faces the heat receiving portion 41. The other end of the container 19 to which end the heat radiating fin group 20 is attached and thermally connected functions as a heat radiating portion 42 of the heat transport member 10.

The heat radiating fin group 20 is formed by arrangement of the plurality of heat radiating fins 21, 21, . . . in parallel. The heat radiating fins 21 are attached in an erected manner to the container 19. Also, main surfaces of the heat radiating fins 21 are arranged in such a manner as to face a direction substantially parallel to a heat transport direction of the heat transport member 10. A method of thermally connecting the heat radiating fins 21 to the heat transport member 10 is not specifically limited, and any known method can be used. For example, there is a method of providing the heat radiating fins 21 in an erected manner in the heat transport member 10 by providing, at end portions of the heat radiating fins 21, fixing pieces (not illustrated) extended in a direction vertical to the main surfaces of the heat radiating fins 21 and by connecting the fixing pieces to a plane portion of the heat transport member 10.

In the heatsink 6, when a gas-phase working fluid flows from the one end to the other end of the container 19, the heat transport member 10 transports heat from the one end to the other end. The gas-phase working fluid that flows to the other end of the container 19 releases latent heat and is changed into a liquid-phase working fluid, and the released latent heat is transferred to the heat radiating fin group 20 thermally connected to the container 19 of the heat transport member 10 by being provided therein in an erected manner. The heat transferred to the heat radiating fin group 20 is released from the heat radiating fin group 20 to an environment outside the heatsink 6.

Also in the heatsink 6, since a cross-sectional area of the cavity 13 in the heat radiating portion 42 is larger than the cross-sectional area of the cavity 13 in a heat insulating portion 43 and the cross-sectional area of the cavity 13 in the heat receiving portion 41, the main surfaces of the heat radiating fins 21 can be enlarged, and many heat radiating fins 21 can be attached to the heat transport member 10. Thus, even in a case where an installation space is limited in a width direction of the heatsink although the installation space is enough in a height direction of the heatsink, heat radiation efficiency of the heat radiating fin group 20 can be improved.

Figure 10:
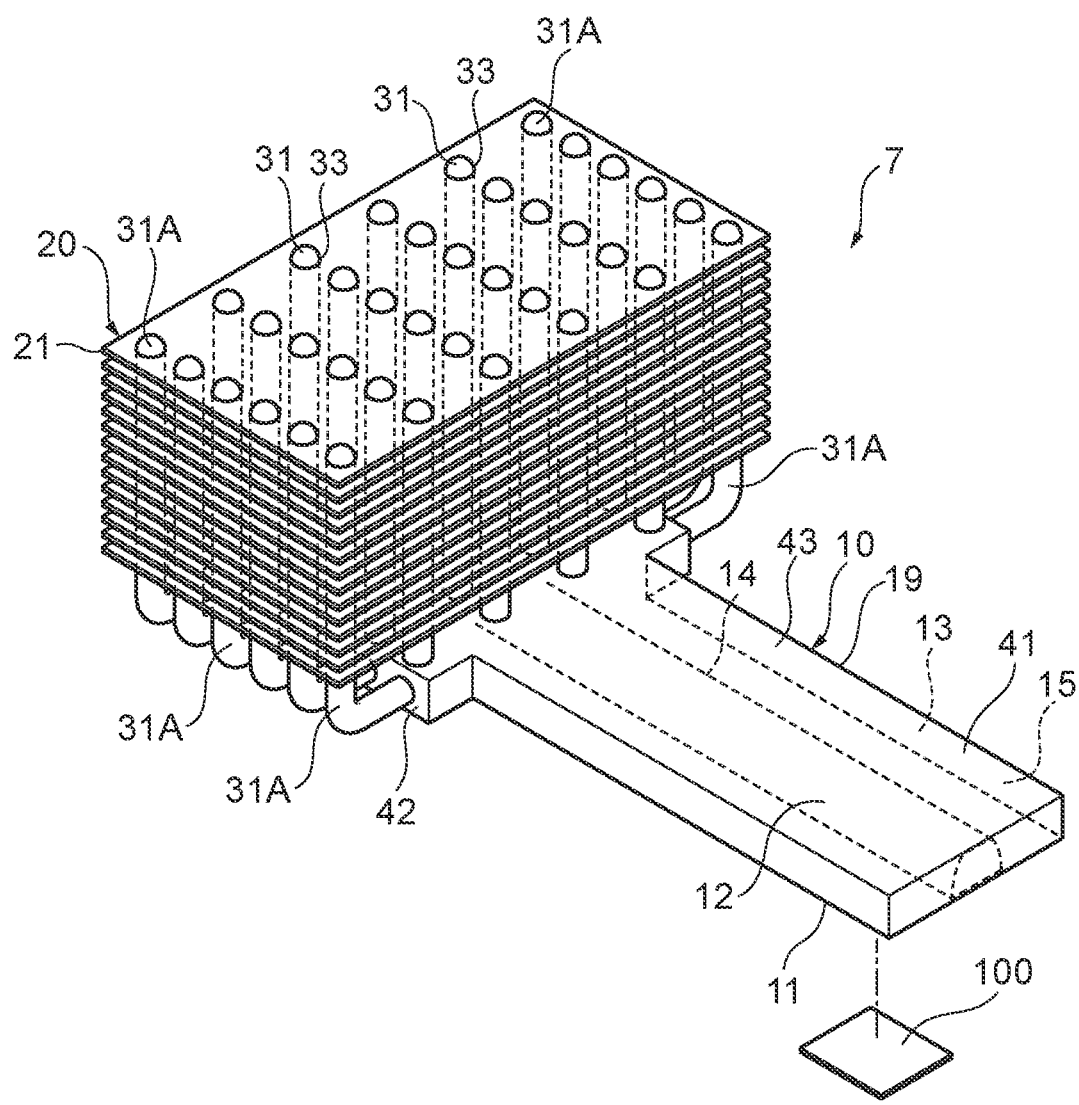
FIG. 10 A perspective view for describing an outline of a heatsink according to a seventh embodiment of the present disclosure.

Next, a heatsink according to a seventh embodiment of the present disclosure will be described with reference to the drawing. Note that since the heatsink according to the seventh embodiment has a main portion in common with those of the heatsinks according to the first to sixth embodiments, the same reference sign is used to describe the same component. Note that FIG. 10 is a perspective view for describing an outline of the heatsink according to the seventh embodiment of the present disclosure.

In a heatsink of each of the first to fifth embodiments, a pipe body is provided in a direction substantially orthogonal to a plane direction of a planar heat transport member, that is, a pipe body is provided in an erected manner in a plane portion of a heat radiating portion of the heat transport member. Alternatively, as illustrated in FIG. 10, a heatsink 7 according to the seventh embodiment includes not only a pipe body 31 provided in an erected manner in a plane portion of a heat radiating portion 42 of a heat transport member 10 but also a pipe body 31A provided in an erected manner on a side surface portion of the heat radiating portion 42 of the heat transport member 10. The pipe body 31A has a part extended in a direction substantially parallel to a plane direction of the planar heat transport member 10 and a part extended in a direction substantially orthogonal to the plane direction of the planar heat transport member 10. A shape of the pipe body 31A is a shape having a bent portion in a longitudinal direction, and is substantially L-shaped. A part of the pipe body 31A which part is extended in the direction substantially parallel to the plane direction of the heat transport member 10 is connected to the side surface portion of the heat radiating portion 42 of the heat transport member 10. Also, a part of the pipe body 31A which part is extended in the direction substantially orthogonal to the plane direction of the heat transport member 10 is extended substantially in parallel to the pipe body 31.

In the heatsink 7, the pipe body 31A is placed in an outer peripheral portion compared to the heat radiating portion 42 of the heat transport member 10. Thus, the part of the pipe body 31A which part is extended in the direction substantially orthogonal to the plane direction of the heat transport member 10 is placed in the outer peripheral portion compared to the heat radiating portion 42 of the heat transport member 10.

Each of heat radiating fins 21 is attached and fixed to positions of the pipe body 31 and the pipe body 31A, and is thermally connected to the pipe body 31 and the pipe body 31A. Each of the heat radiating fins 21 is attached to the part of the pipe body 31A which part is extended in the direction substantially orthogonal to the plane direction of the heat transport member 10. In the heatsink 7, a plurality of the pipe bodies 31, 31, . . . is attached from a central portion to an edge of a main surface of each of the heat radiating fins 21, and a plurality of the pipe bodies 31A, 31A, . . . is attached to the edge of the main surface of each of the heat radiating fins 21. Thus, in each of the heat radiating fins 21 of the heatsink 7, the main surface of the heat radiating fin 21 can be further enlarged, and heat radiation efficiency is improved in the entire main surface of the heat radiating fin 21.

From the above, in the heatsink 7, even in a case where an installation space is limited in a width direction of the heatsink although the installation space is enough in a height direction of the heatsink, heat radiation performance of a heat radiating fin group 20 can be improved. Thus, in the heatsink 7, even in a case where an installation space is limited in the width direction of the heatsink although the installation space is enough in the height direction of the heatsink, heat radiation performance of the heat radiating fin group 20 is improved and good cooling performance can be delivered with respect to a heating element 100.

Next, a different embodiment of a heatsink of the present disclosure will be described in the following. In a heatsink according to each of the above embodiments, a cross-sectional area of a cavity in a heat insulating portion is substantially the same as the cross-sectional area of the cavity in a heat receiving portion. Alternatively, an aspect that a cross-sectional area of a cavity in a heat receiving portion is larger than the cross-sectional area of the cavity in a heat insulating portion may be employed. With the aspect, specifically, even in a case where an installation space is limited in a width direction of a heatsink although the installation space is enough in a height direction of the heatsink, it is possible to prevent blockage of reflux to a heat receiving portion by pressure from a gas-phase working fluid when a liquid-phase working fluid flows back from a pipe body and a heat radiating portion of a heat transport member to the heat receiving portion.

A heatsink of the present disclosure can improve heat radiation efficiency of a heat radiating fin and deliver good cooling performance even in an environment in which an installation space in a width direction of the heatsink is limited although the installation space in a height direction of the heatsink is enough. From the above, for example, the heatsink is highly useful in a field of cooling an electronic component that is installed in a narrow space and that generates a large amount of heat, the component being an electronic component such as a central processing unit, for example.

What is claimed is:

1. A heatsink comprising:
a heat transport member having a heat receiving portion thermally connected to a heating element; a pipe body connected to a heat radiating portion of the heat transport member; and a heat radiating fin group which is thermally connected to the pipe body and in which a plurality of heat radiating fins is arranged, wherein
the heat transport member has an integral internal space that communicates from the heat receiving portion to a connection portion with the pipe body and that is filled with a working fluid, the internal space of the heat transport member communicating with an internal space of the pipe body,
a cross-sectional area of an internal space in a direction orthogonal to a heat transport direction of the heat transport member in the heat radiating portion is larger than the cross-sectional area in a heat insulating portion between the heat receiving portion and the heat radiating portion,
a wick structure is provided in the heat transport member, a different wick structure is provided in the pipe body, and the wick structure and the different wick structure are connected via a connection member,
the wick structure provided in the heat transport member has a trunk portion extended from the heat receiving portion to the heat radiating portion of the heat transport member, and a plurality of branch portions branching from the trunk portion in the heat radiating portion, wherein
an intermediate portion placed between the heat receiving portion and the heat radiating portion functions as the heat insulating portion,
the heat receiving portion is thermally connected to the heating element and is separated from the heat radiating portion of the heat transport member to which the heat radiating fin group is thermally connected via the pipe body by the intermediate portion,
the pipe body is provided in an erected manner in a plane portion of the heat radiating portion of the heat receiving portion, the heat insulating portion and the heat radiating portion extending on the same plane, the pipe body is not extended in the width direction of the heat transport member, and
the plurality of branch portions, which are branched from the trunk portion in a plane direction of the heat transport member, sandwich a portion where the pipe body is arranged in parallel at a predetermined interval in the longitudinal direction and the width direction of the heat transport member is connected to the heat radiating portion.

2. The heatsink according to claim 1, wherein the cross-sectional area in the heat receiving portion is the same as the cross-sectional area in the heat insulating portion.

3. The heatsink according to claim 1, wherein the cross-sectional area in the heat receiving portion is larger than the cross-sectional area in the heat insulating portion.

4. The heatsink according to claim 1, wherein the pipe body is extended in an arrangement direction of the heat radiating fins.

5. The heatsink according to claim 1, wherein an extension direction of the pipe body is not parallel to the heat transport direction of the heat transport member.

6. The heatsink according to claim 1, wherein at least one surface of the heat transport member has a planar shape.

7. The heatsink according to claim 1, wherein the heat transport member has a step portion in a direction orthogonal to the heat transport direction.

8. The heatsink according to claim 1, wherein the connection member is a wick member having capillary force.

9. The heatsink according to claim 8, wherein a kind of the wick structure provided in the heat transport member, a kind of the different wick structure provided in the pipe body, and a kind of the wick member are different.

10. The heatsink according to claim 1, wherein the different wick structure provided in the pipe body is a plurality of narrow grooves formed in an inner surface of the pipe body.

* * * * *